(12) United States Patent
Cheng et al.

(10) Patent No.: US 8,587,068 B2
(45) Date of Patent: Nov. 19, 2013

(54) SRAM WITH HYBRID FINFET AND PLANAR TRANSISTORS

(75) Inventors: Kangguo Cheng, Schenectady, NY (US); Wilfried E.-A. Haensch, Somers, NY (US); Ali Khakifirooz, Mountain View, CA (US); Pranita Kulkarni, Slingerlands, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/359,454

(22) Filed: Jan. 26, 2012

(65) Prior Publication Data

US 2013/0193515 A1    Aug. 1, 2013

(51) Int. Cl.
*H01L 21/265*    (2006.01)

(52) U.S. Cl.
USPC ............................ 257/350; 438/197

(58) Field of Classification Search
USPC ........................................... 257/350
See application file for complete search history.

(56) References Cited

U.S. PATENT DOCUMENTS

| | | | | |
|---|---|---|---|---|
| 5,206,533 A * | 4/1993 | Houston | ...................... | 257/393 |
| 5,382,807 A * | 1/1995 | Tsutsumi et al. | ................ | 257/69 |
| 5,777,920 A * | 7/1998 | Ishigaki et al. | ................ | 365/154 |
| 5,892,261 A * | 4/1999 | Lin et al. | ....................... | 257/355 |
| 5,965,905 A * | 10/1999 | Hayashi | ........................... | 257/60 |
| 6,140,684 A * | 10/2000 | Chan et al. | .................... | 257/368 |
| 6,160,294 A * | 12/2000 | Hashimoto | .................... | 257/369 |
| 6,160,298 A * | 12/2000 | Ohkubo | ......................... | 257/393 |
| 6,166,447 A * | 12/2000 | Park | ................................ | 257/66 |
| 6,222,234 B1 | 4/2001 | Imai | | |
| 6,404,024 B1 * | 6/2002 | Ishigaki | ........................ | 257/401 |
| 6,507,079 B2 * | 1/2003 | Komori | ......................... | 257/393 |
| 6,562,665 B1 | 5/2003 | Yu | | |
| 6,767,793 B2 * | 7/2004 | Clark et al. | .................... | 438/286 |
| 6,809,399 B2 * | 10/2004 | Ikeda et al. | .................... | 257/536 |
| 6,949,768 B1 | 9/2005 | Anderson et al. | | |
| 7,061,054 B2 * | 6/2006 | Tomiye et al. | ................. | 257/368 |
| 7,238,555 B2 * | 7/2007 | Orlowski et al. | ............. | 438/151 |
| 7,301,206 B2 | 11/2007 | Yeo et al. | | |
| 7,309,635 B2 * | 12/2007 | Park | .............................. | 438/289 |
| 7,479,421 B2 | 1/2009 | Kavalieros et al. | | |
| 7,501,674 B2 | 3/2009 | Lee et al. | | |
| 7,512,017 B2 | 3/2009 | Chang | | |

(Continued)

OTHER PUBLICATIONS

J.P. Colinge, Multi-gate SOI MOSFETs, Microelectronic Engineering vol. 84, Issues 9-10, Sep.-Oct. 2007, pp. 2071-2076 INFOS 2007.

*Primary Examiner* — Thao Le
(74) *Attorney, Agent, or Firm* — Law Offices of Ira D. Blecker, P.C.

(57) ABSTRACT

An SRAM structure and method which includes a semiconductor on insulator (SOI) substrate which includes a semiconductor substrate, an insulating layer and a semiconductor on insulator (SOI) layer. The SOI layer has a first thickness. The SRAM structure further includes a FinFET transistor formed on the SOI substrate including a first defined portion of the SOI layer of the first thickness forming an active layer of the FinFET transistor and a gate dielectric on the first defined portion of the SOI layer and a planar transistor formed on the SOI substrate including a second defined portion of the SOI layer of a second thickness forming an active layer of the planar transistor and a gate dielectric on the second defined portion of the SOI layer. The first thickness is greater than the second thickness. Also included is a gate electrode on the FinFET transistor and the planar transistor.

20 Claims, 10 Drawing Sheets

(56) References Cited

U.S. PATENT DOCUMENTS

| | | | |
|---|---|---|---|
| 7,566,619 B2 | 7/2009 | Ahn et al. | |
| 7,825,437 B2* | 11/2010 | Pillarisetty et al. | 257/204 |
| 7,911,028 B2* | 3/2011 | Lin et al. | 257/532 |
| 8,193,567 B2* | 6/2012 | Kavalieros et al. | 257/288 |
| 8,216,902 B2* | 7/2012 | Chang et al. | 438/275 |
| 2004/0266076 A1* | 12/2004 | Doris et al. | 438/157 |
| 2005/0017377 A1* | 1/2005 | Joshi et al. | 257/903 |
| 2005/0082622 A1* | 4/2005 | Ikeda et al. | 257/379 |
| 2006/0038234 A1* | 2/2006 | Liaw | 257/368 |
| 2008/0303105 A1* | 12/2008 | Chang et al. | 257/412 |
| 2009/0224245 A1* | 9/2009 | Umezaki | 257/59 |
| 2010/0025776 A1* | 2/2010 | Horstmann et al. | 257/392 |
| 2011/0068400 A1* | 3/2011 | Wang et al. | 257/347 |
| 2011/0111584 A1* | 5/2011 | Chen et al. | 438/591 |

* cited by examiner

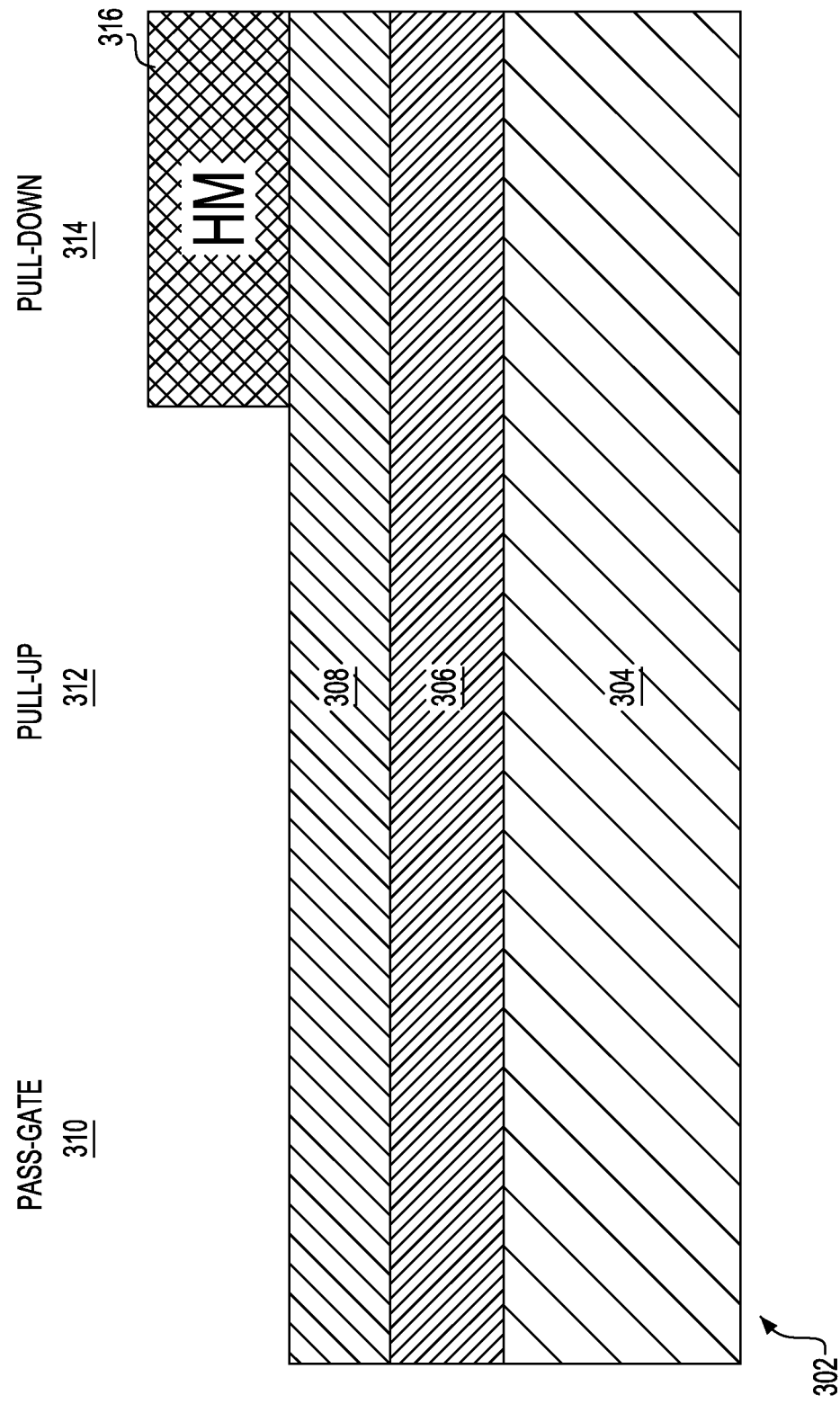

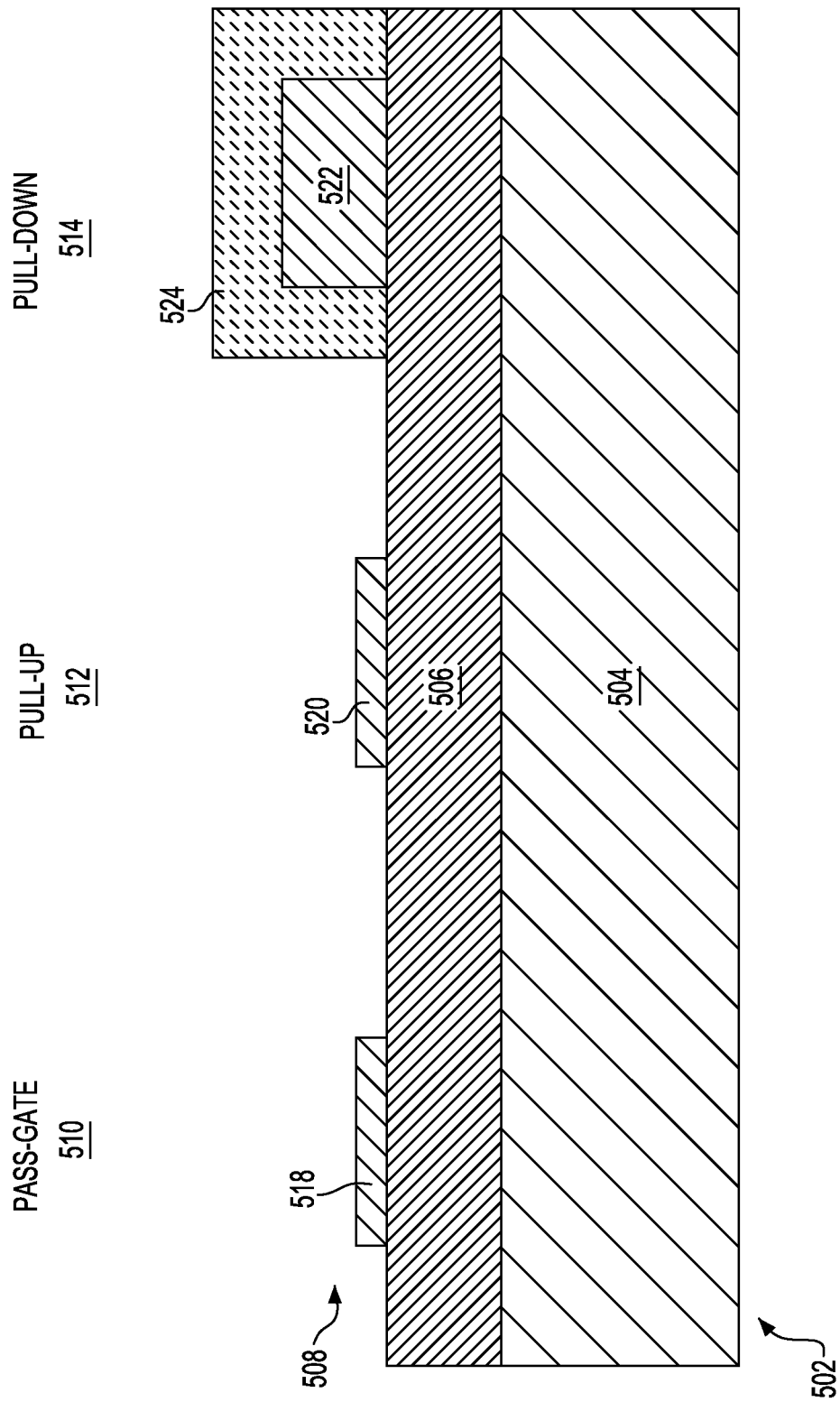

SRAM WITH HYBRID FINFET AND PLANAR TRANSISTORS

BACKGROUND

The present invention relates to the formation of a hybrid SRAM cell on an SOI substrate and, more particularly, relates to an SRAM cell with both FinFET and planar transistors formed in the SOI layer of the SOI substrate.

A typical SRAM (static random access memory) cell typically includes pull-up, pull-down and pass-gate transistors (semiconductor devices). SRAM cells may require transistors with different width for best performance. Usually pull-down devices are wider than pull-up and pass-gate devices which complicates the lithography.

FIG. 1 illustrates a conventional SRAM cell 100 which includes a plurality of active areas 102, 104, 106, 108, 110, 112 and a plurality of gate electrodes 114, 116, 118, 120. The area 122 between the active areas 102, 104, 106, 108, 110, 112 is insulator, usually oxide. Where gate electrodes 114, 118 intersect with active areas 102, 110 are formed pull-down transistors 124, 126. Where gate electrodes 114, 116, 118, 120 intersect with active areas 104, 106, 108, 112 are formed pull-up or pass-gate transistors 128, 130, 132, 134 as shown in FIG. 1. The pull-down transistors 124, 126 have an active area 102, 110 with a width larger than active areas 104, 106, 108, 112 for optimum cell performance.

BRIEF SUMMARY

The various advantages and purposes of the exemplary embodiments as described above and hereafter are achieved by providing, according to a first aspect of the exemplary embodiments, an SRAM structure. The SRAM structure includes a semiconductor on insulator (SOI) substrate comprising a semiconductor substrate, an insulating layer and a semiconductor on insulator (SOI) layer, the SOI layer having a first thickness; a FinFET transistor formed on the SOI substrate comprising a first defined portion of the SOI layer of the first thickness forming an active layer of the FinFET transistor and a gate dielectric on the first defined portion of the SOI layer; a planar transistor formed on the SOI substrate comprising a second defined portion of the SOI layer of a second thickness forming an active layer of the planar transistor and a gate dielectric on the second defined portion of the SOI layer. The first thickness is greater than the second thickness. The SRAM structure further includes a gate electrode on the FinFET transistor and the planar transistor.

According to a second aspect of the exemplary embodiments, there is provided a method of forming a hybrid SRAM structure. The method includes obtaining a semiconductor on insulator (SOI) substrate comprising a semiconductor substrate, an insulating layer and a semiconductor on insulator (SOI) layer, the SOI layer having a first thickness; defining a first portion and a second portion of the SOI layer; removing the SOI layer down to the insulating layer between the first and second portions; thinning the second portion of the SOI layer to have a second thickness wherein the second thickness is less than the first thickness; and applying a gate electrode over the first and second portions to form a FinFET transistor and a planar transistor, respectively.

BRIEF DESCRIPTION OF SEVERAL VIEWS OF THE DRAWINGS

The features of the exemplary embodiments believed to be novel and the elements characteristic of the exemplary embodiments are set forth with particularity in the appended claims. The Figures are for illustration purposes only and are not drawn to scale. The exemplary embodiments, both as to organization and method of operation, may best be understood by reference to the detailed description which follows taken in conjunction with the accompanying drawings in which:

FIGS. 3A to 3D are cross-sectional views in the direction of 3-3 in FIG. 2 illustrating a first method of forming the SRAM cell of FIG. 2 where:

FIG. 3A illustrates an SOI layer with a first portion blocked off by a hard mask;

FIG. 3B illustrates the thinning of the exposed SOI layer;

FIG. 3C illustrates defining active areas according to a pass-gate area, a pull-up area and a pull-down area;

FIG. 3D illustrates the formation of a gate dielectric and gate electrode on the active areas of FIG. 3C.

FIGS. 5A and 5B are cross-sectional views in the direction of 3-3 in FIG. 2 illustrating a second method of forming the SRAM cell of FIG. 2 where:

FIG. 5A illustrates the defined active areas and the active area for the pull-down area being covered by a hard mask; and FIG. 5B illustrates the defined active areas of FIG. 5A after being thinned.

DETAILED DESCRIPTION

The advantages of the exemplary embodiments have been achieved by providing a hybrid SRAM cell on a semiconductor on insulator (SOI) substrate. The pull-down transistors are FinFETs and the pull-up and pass-gate transistors are planar transistors. All of the transistors in the SRAM cell have the same footprint but the effective width, i.e., the circumference of the fin in contact with the gate dielectric, of the pull-down transistors is greater than that of the pull-up and pass-gate transistors in that the pull-down transistors are three dimensional FinFETs. Such an architecture makes for simpler lithography.

Figure 1:
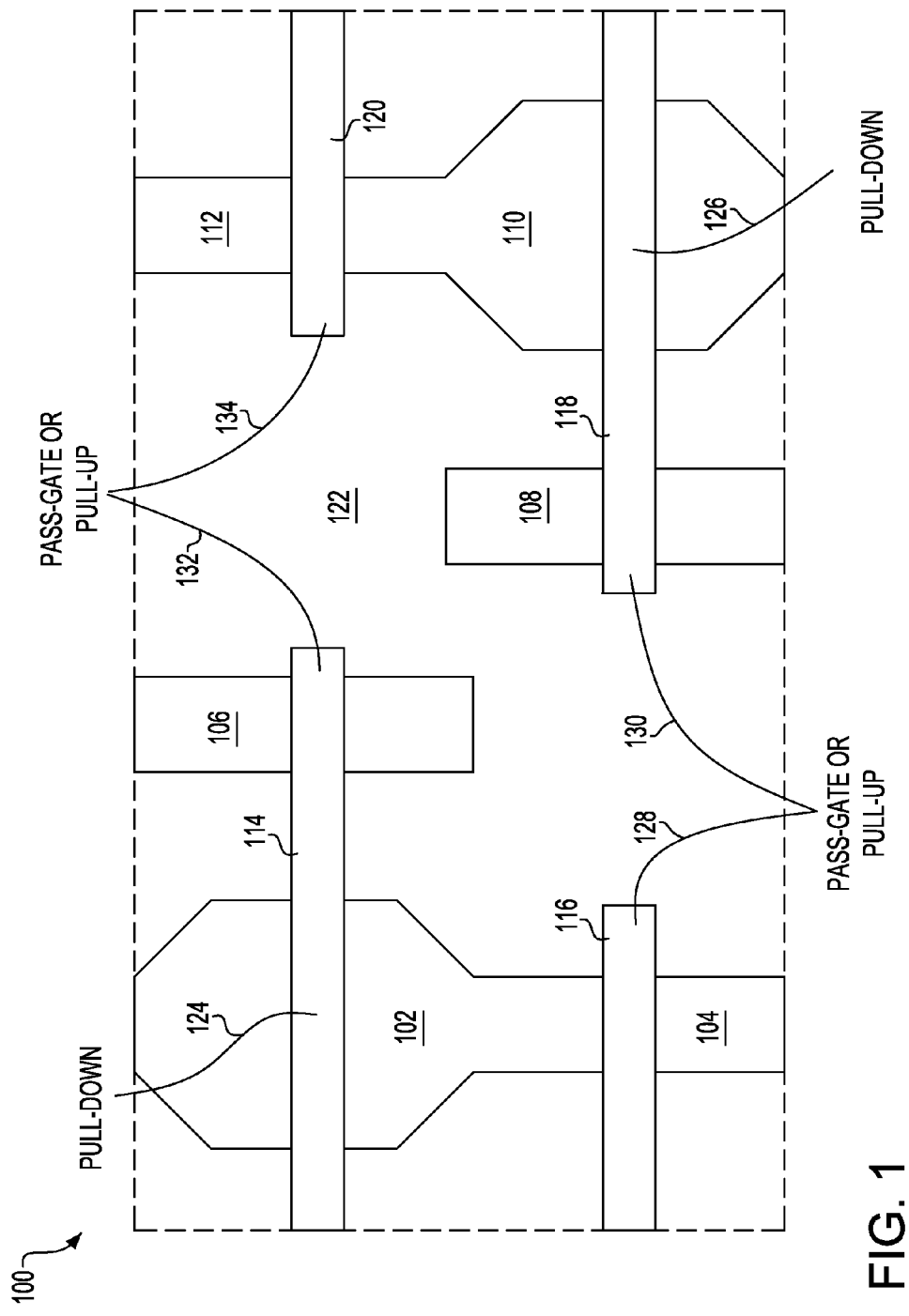
FIG. 1 is a plan view of a conventional SRAM cell.
Figure 2:
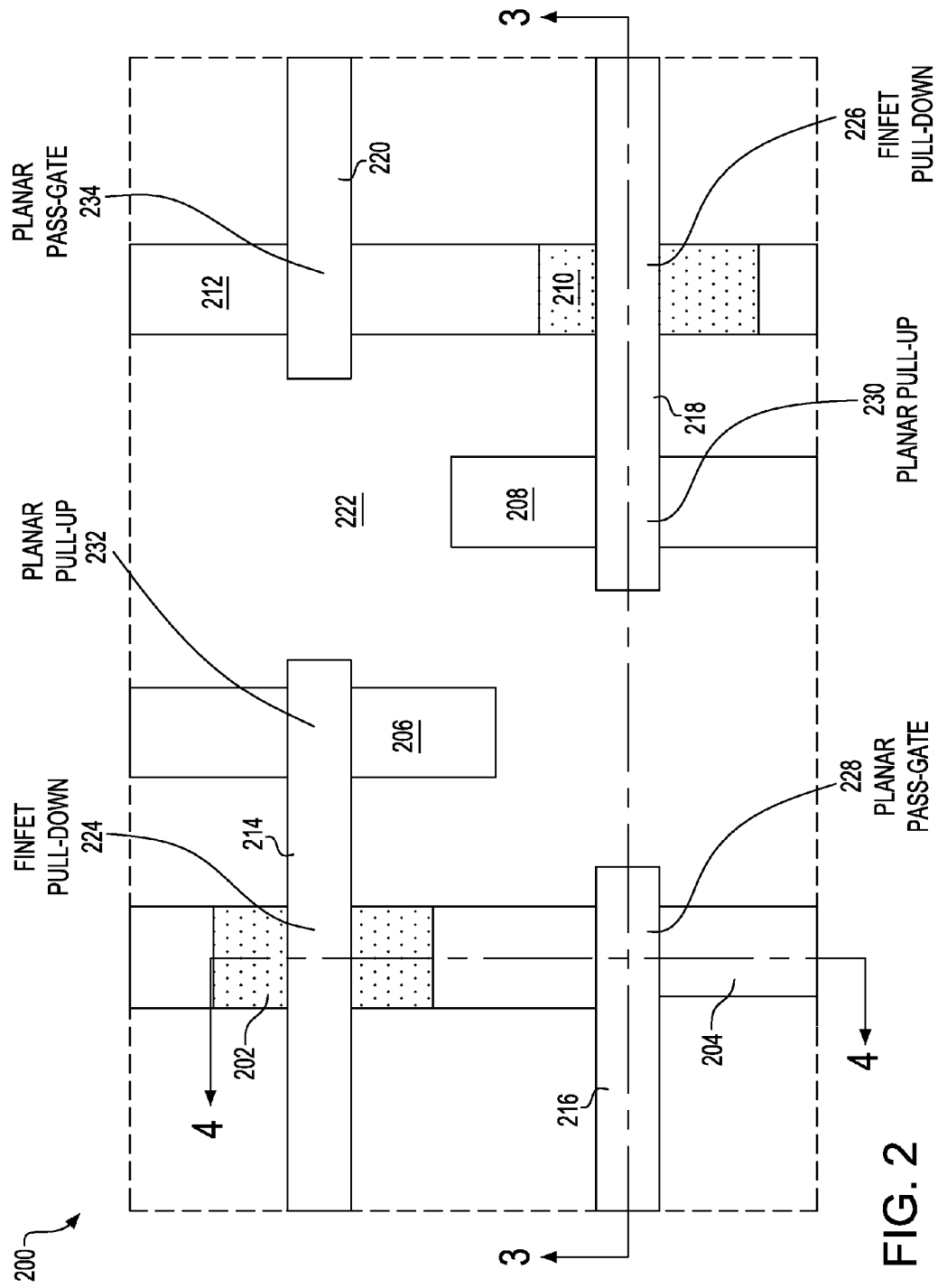
FIG. 2 is a plan view of an SRAM cell according to the exemplary embodiments.

Referring to the Figures in more detail, and particularly referring to FIG. 2, there is shown an SRAM cell 200 according to the exemplary embodiments. The SRAM cell 200 includes a plurality of active areas 202, 204, 206, 208, 210, 212 and a plurality of gate electrodes 214, 216, 218, 220. The area 222 between the active areas 202, 204, 206, 208, 210, 212 is insulator, usually oxide. Where gate electrodes 214, 218 intersect with active areas 202, 210 are formed pull-down transistors 224, 226. Where gate electrodes 214, 216, 218, 220 intersect with active areas 204, 206, 208, 212 are formed pull-up or pass-gate transistors 228, 230, 232, 234 as shown in FIG. 2. For the purpose of illustration and not limitation, transistors 228, 234 are planar pass-gate transistors and transistors 230, 232 are planar pull-up transistors. All of the transistors 224, 226, 228, 230, 232, 234 have an active area 202, 204, 206, 208, 210 212 with the same width, although as will be seen, pull-down transistors 224, 226 have an active area 202, 210 with a higher effective width. The pull-down transistors 224, 226 may be three-dimensional FinFETs, preferably trigate transistors, while the pull-up and pass-gate transistors 228, 230, 232, 234 may be planar transistors.

Figure 3B:
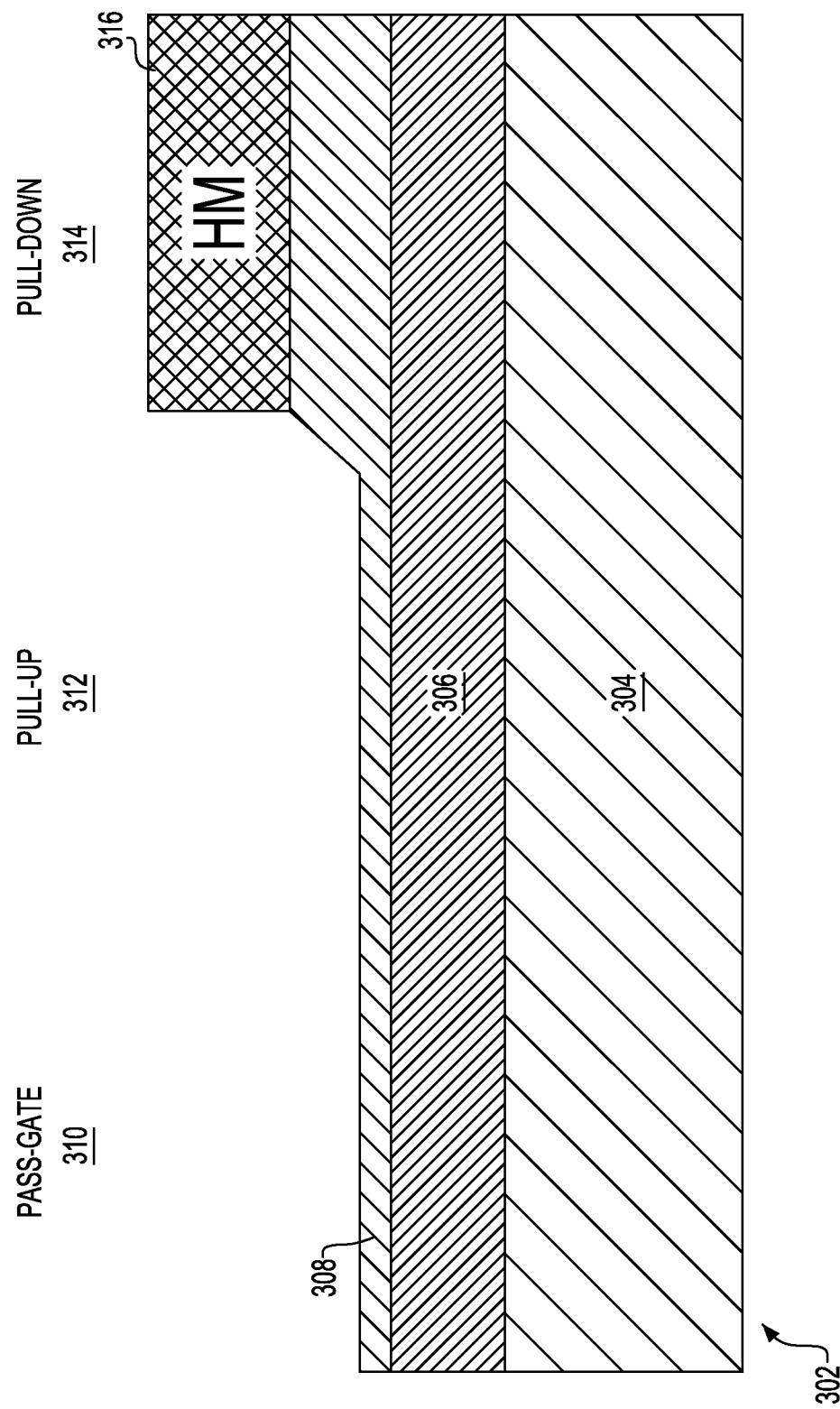

Referring now to FIGS. 3A to 3D, a first method will be described for the formation of the SRAM cell 200 illustrated in FIG. 2. FIGS. 3A to 3D are cross-sectional views taken in the direction of plane 3-3 shown in FIG. 2. Referring first to FIG. 3A, SOI substrate 302 includes a semiconductor base 304, an insulating layer often referred to as a buried oxide layer or "BOX" layer 306 and a semiconductor on insulator (SOI) layer 308. The semiconductor base 304 may be made from any semiconductor material such as silicon, silicon germanium, germanium, III-V compound, or II-VI compound semiconductor. Similarly, the SOI layer 308 may be made from the same semiconductor materials but is usually silicon. The SOI layer 308 may have a thickness of about 20 to 50 nanometers (nm).

The SOI substrate 302 may be divided up into a pass-gate area 310 where a pass-gate transistor may be formed, a pull-up area 312 where a pull-up transistor may be formed and a pull-down area 314 where a pull-down transistor may be formed. The arrangement of the pass-gate area 310, pull-up area 312 and pull-down area 314 shown in FIGS. 3A to 3E is for purpose of illustration and not limitation and may differ depending on the architecture of the SRAM cell 200 shown in FIG. 2. In the present exemplary embodiment, the pull-down area 314 further includes a hard mask 316, such as a nitride, formed over the SOI layer 308. The hard mask 316 may be formed by blanket depositing a hard mask layer and then lithographically patterning the hard mask layer to result in the hard mask 316 shown in FIG. 3A.T*he* hard mask 316 protects the SOI layer 308 in the pull-down area 314 during the next thinning step.

Referring now to FIG. 3B, the exposed portion of the SOI layer 308 (i.e., the part of the SOI layer 308 not covered by hard mask 316) is thinned to approximately 3 to 15 nm. Thinning may be performed by wet or dry chemical etching or by oxidation of the SOI layer 308 and then removal of the oxide. The pass-gate area 310 and pull-up area 312 (as well as the space in between) is thinned to the approximately 3 to 15 nm dimension while the SOI layer 308 in the pull-down area 314 may remain at the initial thickness of approximately 20 to 50 nm.

Figure 3C:
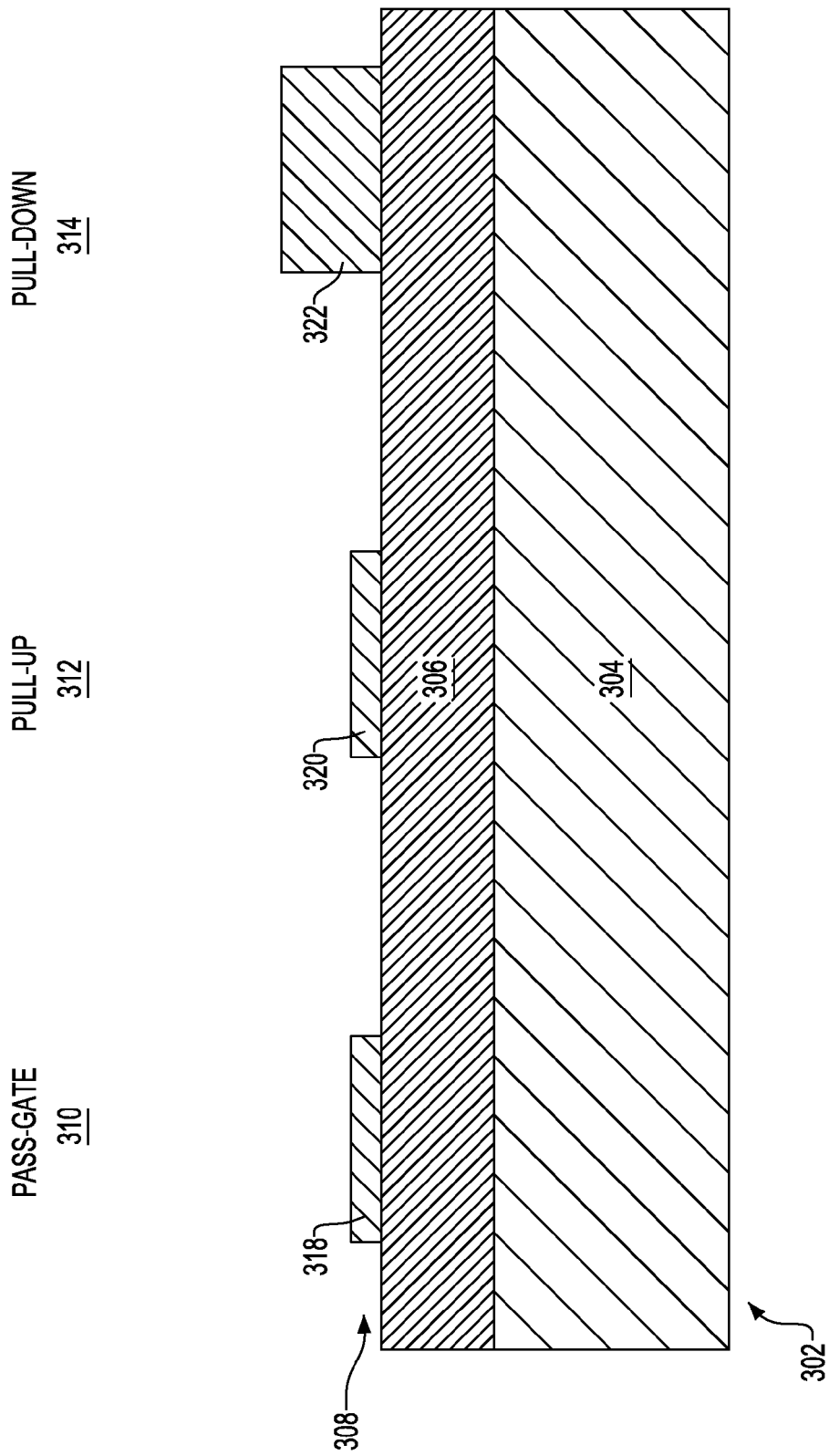

The hard mask 316 is conventionally stripped and then the SOI layer 308 is lithographically patterned to remove the SOI layer 308 from unwanted regions and to form active area 318 in pass-gate area 310, active area 320 in pull-up area 312 and active area 322 in pull-down area 314 as shown in FIG. 3C. It is noted that active area 322 is substantially thicker than active areas 318, 320.

Thereafter, a gate dielectric and a gate electrode may be formed on the active areas. The gate dielectric and gate electrode may be formed by a gate-first or a gate-last process. In a gate-first process, the gate dielectric and gate electrode layers are deposited and then patterned in a single step. In a gate-last process (also called a replacement gate process), a dummy gate is formed followed by the formation of spacers and other features and then the dummy gate is removed and replaced with the desired gate structure.

For purpose of illustration and not limitation, the gate-first process will be described although it should be understood that the gate-last process may also be used in the exemplary embodiments.

Figure 3D:
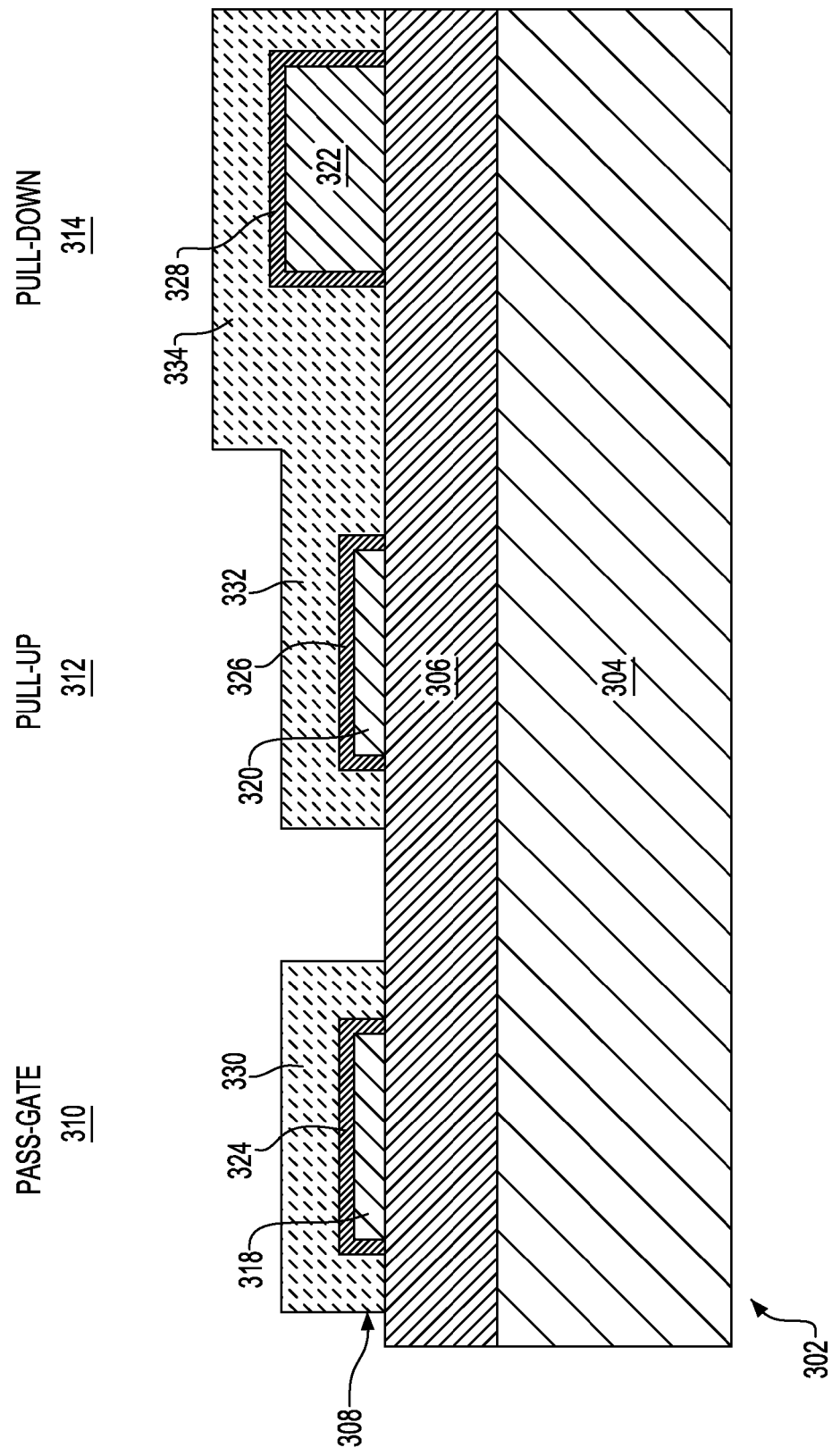

As shown in FIG. 3D, conventional dielectric layer (or layers) of a gate oxide are deposited everywhere by conventional means. High dielectric constant (high-k) oxides may be used for the gate dielectric. Then, materials for the gate electrode are deposited everywhere over the gate dielectric. Materials for the gate electrode may include polysilicon, titanium nitride, tantalum nitride, tungsten, copper, etc. After lithographically defining areas where the gate dielectric material and gate electrode material should stay, the gate dielectric material and gate electrode material may be removed in a single step from non-active (non-SOI) regions to result in gate dielectric 324 and gate electrode 330 on active area 318, gate dielectric 326 and gate electrode 332 on active area 320 and gate dielectric 328 and gate electrode 334 on active area 322.

Figure 4:
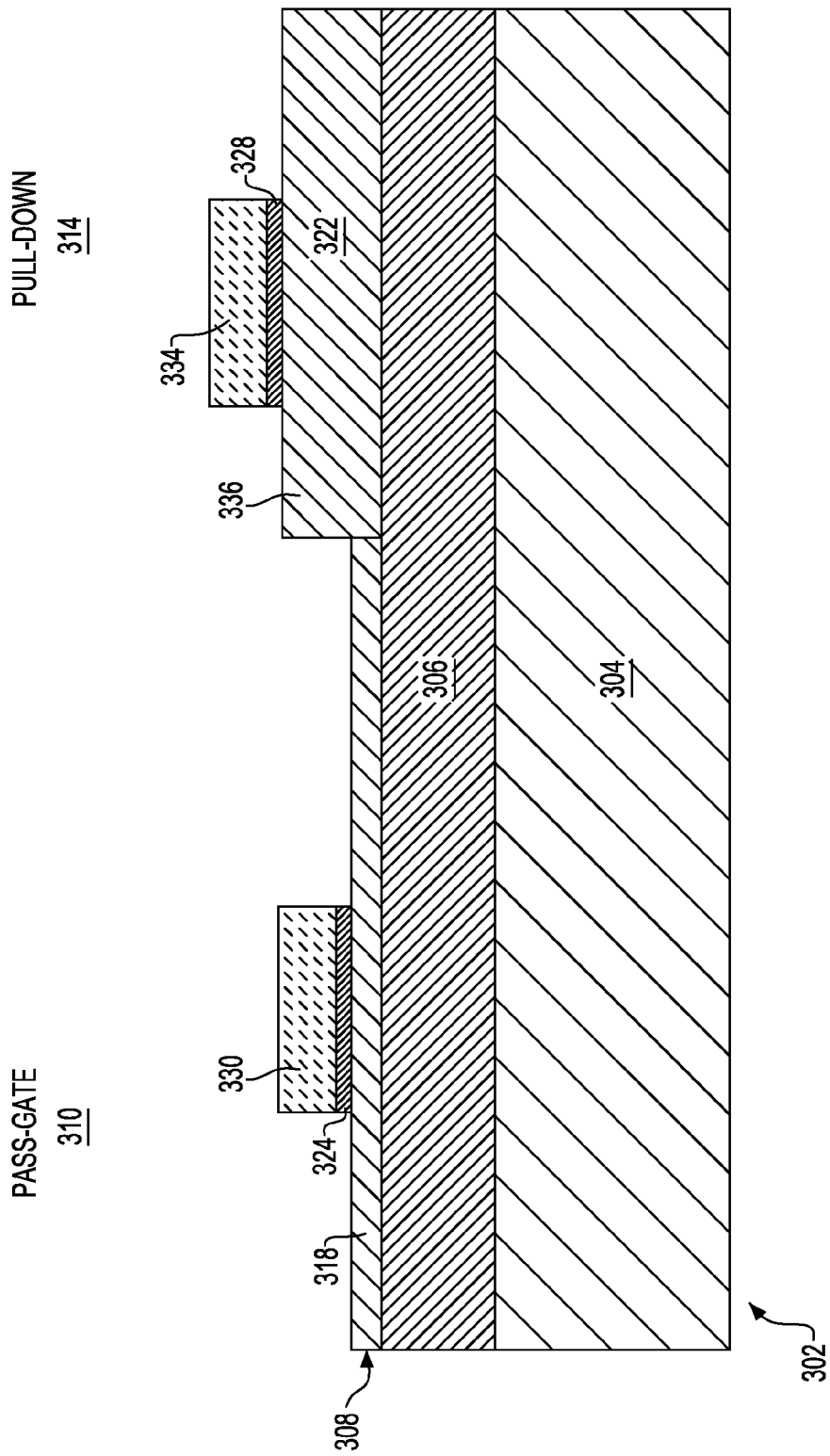
FIG. 4 is a cross-sectional view in the direction of 4-4 in FIG. 2.

Referring now to FIG. 4, FIG. 4 is a cross-sectional view taken in the direction of plane 4-4 shown in FIG. 2. As shown in FIG. 4, the active area 318 for pass-gate area 310 forms a part of SOI layer 308. The pass-gate transistor that will be formed in pass-gate area 310 after suitable doping and implanting is a planar transistor and only has one gate. The pull-down transistor that will be formed in pull-down area 314 after suitable doping and implanting is a three dimensional transistor generically called a FinFET or multigate device but preferably is a trigate transistor because it may have three gates. Each three dimensional device includes a narrow vertical fin body 322 of semiconductor material with vertically-projecting sidewalls. A gate electrode 334 may intersect a channel region of the fin body 322 and may be isolated electrically from the fin body 322 by a thin gate dielectric layer 328. Flanking the central channel region at opposite ends of the fin body are heavily-doped source/drain regions 336.

After the formation of the gate electrodes 330, 332, 334 as shown in FIG. 3D, the process proceeds with the usual device fabrication process steps.

Figure 5A:
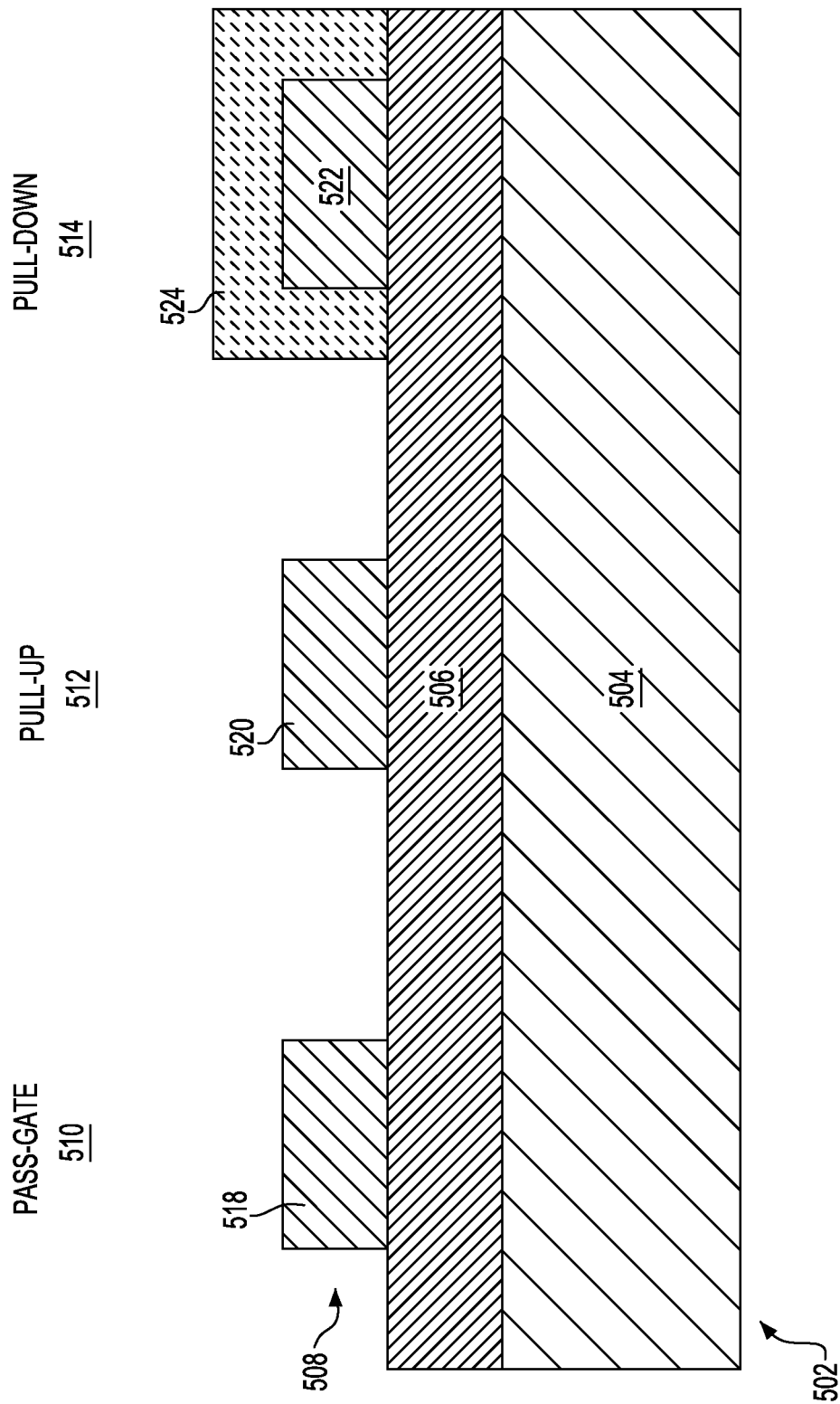

Referring now to FIGS. 5A and 5B, a second method will be described for the formation of the SRAM cell 200 illustrated in FIG. 2. FIGS. 5A and 5B are cross-sectional views taken in the direction of plane 3-3 shown in FIG. 2. Referring first to FIG. 5A, SOI substrate 502 includes a semiconductor base 504, a BOX layer 506 and an SOI layer 508. As in the first method, the semiconductor base 504 may be made from any semiconductor material such as silicon, silicon germanium, germanium, III-V compound, or II-VI compound semiconductor. Similarly, the SOI layer 508 may be made from the same semiconductor materials but is usually silicon. The SOI layer 508 may have a thickness of about 20 to 50 nanometers (nm).

The SOI substrate 502 may be divided up into a pass-gate area 510 where a pass-gate transistor may be formed, a pull-up area 512 where a pull-up transistor may be formed and a pull-down area 514 where a pull-down transistor may be formed. The arrangement of the pass-gate area 510, pull-up area 512 and pull-down area 514 shown in FIGS. 5A and 5B is for purpose of illustration and not limitation and may differ depending on the architecture of the SRAM cell 200 shown in FIG. 2.

In a subsequent step after lithographically defining the active areas, the active areas of the SOI layer 508 are defined before thinning of the active areas in the pass-gate area 510 and the pull-up area 512.

Thus, the SOI layer 508 is lithographically patterned to remove the SOI layer 508 from unwanted regions and to form active area 518 in pass-gate area 510, active area 520 in pull-up area 512 and active area 522 in pull-down area 514 as shown in FIG. 5A.

In the present exemplary embodiment, the pull-down area 514 further includes a hard mask 524, such as a oxide, nitride or a combination thereof, formed only over the active area 522 in pull-down area 514. The hard mask 524 may be formed by blanket depositing a hard mask layer and then lithographically patterning the hard mask layer to result in the hard mask 524 shown in FIG. 5A.

Referring now to FIG. 5B, the active areas 518, 520 are thinned to approximately 3 to 15 nm. Thinning may be performed by wet or dry chemical etching or by oxidation of the SOI layer 508 and then removal of the oxide. Active area 522, protected by the hard mask 524 is protected from the thinning process and may remain at the initial thickness of approximately 20 to 50 nm.

The hard mask 524 may then be conventionally stripped followed by formation of the gate dielectric and gate electrode as described in the first method.

One possible concern with the second method is that the active areas 518, 520 may be laterally thinned when the active areas 518, 520 are thinned as described above. That is, there is a possibility that the active areas 518, 520 could be horizontally reduced in dimension when the active areas 518, 520 are vertically thinned (assuming the orientation of the SOI substrate 502 shown in FIGS. 5A and 5B).

Figure 6:
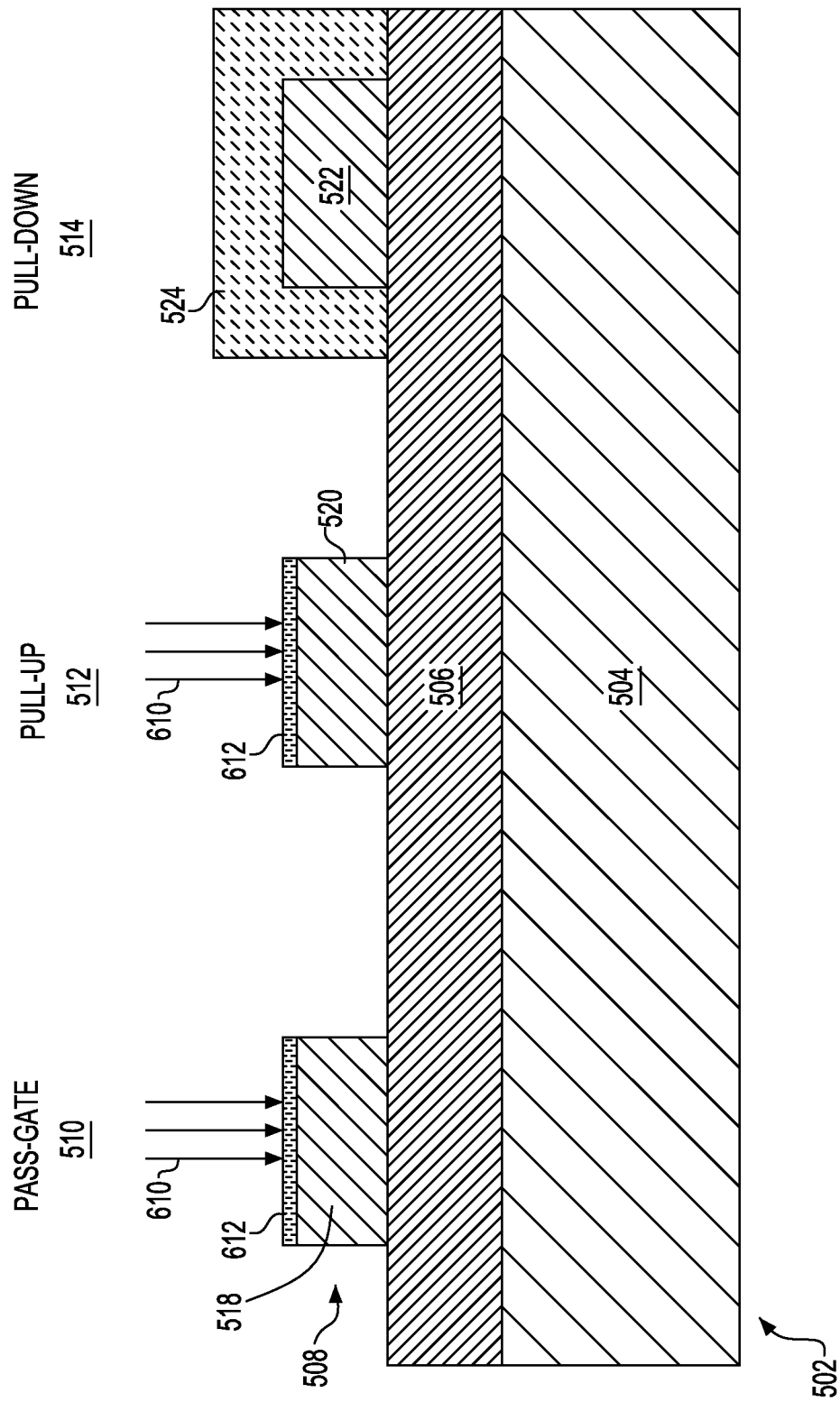
FIG. 6 is a view similar to FIG. 5A and further including an etch enhancer on the active areas prior to thinning.

Accordingly, it is proposed to enhance the vertical etch rate of active areas 518, 520 by doing a vertical ion implant 610 which forms a layer 612 on active areas 518, 520 as shown in FIG. 6. The presence of the implanted ions enhances the etch rate of the SOI layer 508. As a result, layer 612 causes the active areas 518, 520 to etch faster in the vertical direction. The implant 610 may be done using impurity ions such as xenon (Xe), krypton (Kr), argon (Ar), fluorine (F), oxygen (O), etc. implanted into the SOI layer 508 at an energy chosen such that the range of implant is 3 to 20 nm in the SOI layer 508.

It will be apparent to those skilled in the art having regard to this disclosure that other modifications of the exemplary embodiments beyond those embodiments specifically described here may be made without departing from the spirit of the invention. Accordingly, such modifications are considered within the scope of the invention as limited solely by the appended claims.

What is claimed is:

1. An SRAM structure comprising:
a semiconductor on insulator (SOI) substrate comprising a semiconductor substrate, an insulating layer and a semiconductor on insulator (SOI) layer, the SOI layer having a first thickness;
a FinFET transistor formed on the SOI substrate comprising a first defined portion of the SOI layer of the first thickness forming an active layer of the FinFET transistor and a gate dielectric on the first defined portion of the SOI layer, the first defined portion of the SOI layer having a first width;
a planar transistor formed on the SOI substrate comprising a second defined portion of the SOI layer of a second thickness forming an active layer of the planar transistor and a gate dielectric on the second defined portion of the SOI layer, the second defined portion of the SOI layer having a second width;
wherein the first thickness is greater than the second thickness and wherein the first width equals the second width; and
a gate electrode on the FinFET transistor and the planar transistor.

2. The SRAM structure of claim 1 wherein the FinFET is a trigate transistor.

3. The SRAM structure of claim 1 wherein the FinFET is a multigate transistor.

4. The SRAM structure of claim 1 wherein the first thickness is 20 to 50 nm (nanometers) and the second thickness is 3 to 15 nm.

5. The SRAM structure of claim 1 wherein the FinFET transistor is a pull-down transistor and the planar transistor is a pull-up transistor or a pass-gate transistor.

6. The SRAM structure of claim 1 comprising a plurality of FinFET transistors and a plurality of planar transistors wherein the plurality of FinFET transistors are first and second pull-down transistors in the SRAM structure and the plurality of planar transistors are first and second pull-up transistors and first and second pass-gate transistors in the SRAM structure.

7. The SRAM structure of claim 1 wherein the gate electrode wraps around the first and second portions of the SOI layer.

8. A method of forming a hybrid SRAM structure comprising:
obtaining a semiconductor on insulator (SOI) substrate comprising a semiconductor substrate, an insulating layer and a semiconductor on insulator (SOI) layer, the SOI layer having a first thickness;
defining a first portion and a second portion of the SOI layer, the first defined portion of the SOI layer having a first width and the second defined portion of the SOI layer having a second width wherein the first width equals the second width;
removing the SOI layer down to the insulating layer between the first and second portions;
thinning the second portion of the SOI layer to have a second thickness wherein the second thickness is less than the first thickness; and
applying a gate electrode over the first and second portions to form a FinFET transistor and a planar transistor, respectively.

9. The method of claim 8 wherein the gate electrode wraps around the first and second portions of the SOI layer.

10. The method of claim 8 wherein the step of thinning is before the step of removing and further comprising applying a hard mask to the first portion prior to the step of thinning.

11. The method of claim 10 further comprising removing the hard mask prior to the step of applying a gate electrode.

12. The method of claim 11 further comprising applying a hard mask to the first portion between the steps of removing and thinning.

13. The method of claim 12 further comprising removing the hard mask prior to the step of applying a gate electrode.

14. The method of claim 12 further comprising applying an etch rate enhancer to horizontal portions of the second portion.

15. The method of claim 14 wherein applying the etch rate enhancer comprising vertical implanting an impurity ion.

16. The method of claim 15 wherein the impurity ion is xenon, krypton, argon, fluorine or oxygen.

17. The method of claim 8 wherein the FinFET is a trigate transistor.

18. The method of claim 8 wherein the FinFET is a multigate transistor.

19. The method of claim 8 wherein the first thickness is 20 to 50 nm (nanometers) and the second thickness is 3 to 15 nm.

20. The method of claim 8 wherein the FinFET transistor is a pull-down transistor and the planar transistor is a pull-up transistor or a pass-gate transistor.

* * * * *